United States Patent [19]

Marancik et al.

[11] Patent Number: 4,646,428
[45] Date of Patent: Mar. 3, 1987

[54] METHOD OF FABRICATING MULTIFILAMENT INTERMETALLIC SUPERCONDUCTOR

[75] Inventors: William G. Marancik, Basking Ridge; Seung-Ok Hong, New Providence, both of N.J.

[73] Assignee: Oxford Superconducting Technology, Carteret, N.J.

[21] Appl. No.: 800,461

[22] Filed: Nov. 21, 1985

[51] Int. Cl.[4] .......................................... H01L 39/24
[52] U.S. Cl. ................................. 29/599; 174/126 S; 148/11.5 R; 148/11.5 Q
[58] Field of Search ..................... 29/599; 148/11.5 R, 148/11.5 F, 11.5 Q; 174/126 S, 128 S

[56] References Cited

U.S. PATENT DOCUMENTS

| | | |
|---|---|---|
| 3,472,705 | 10/1969 | Gregory . |
| 3,472,944 | 10/1969 | Morton et al. . |
| 3,708,606 | 1/1973 | Shattes et al. . |
| 3,710,000 | 1/1973 | Shattes et al. . |
| 3,728,165 | 4/1973 | Howlett . |
| 3,731,374 | 5/1973 | Suenaga et al. . |
| 3,800,414 | 4/1974 | Shattes et al. . |
| 3,807,041 | 4/1974 | McDougall . |
| 3,838,503 | 10/1974 | Suenaga et al. . |
| 3,905,839 | 9/1975 | Hashimoto . |
| 3,910,802 | 10/1975 | Wong . |
| 3,918,998 | 11/1975 | Marancik et al. . |
| 3,930,903 | 1/1976 | Randall et al. . |
| 3,958,327 | 5/1976 | Marancik et al. . |
| 3,963,425 | 6/1976 | Sambrook . |
| 4,073,666 | 2/1978 | Marancik et al. . |
| 4,101,731 | 7/1978 | Marancik . |
| 4,195,199 | 3/1980 | Hillmann et al. . |
| 4,215,465 | 8/1980 | Dew-Hughes ............... 174/126 S X |
| 4,224,735 | 9/1980 | Young et al. . |
| 4,409,297 | 10/1983 | Howe . |
| 4,447,946 | 5/1984 | Marancik . |
| 4,489,219 | 12/1984 | Suenaga et al. ............ 174/126 S X |
| 4,501,062 | 2/1985 | Hillmann et al. . |
| 4,506,109 | 3/1985 | Onishi et al. ................. 174/126 S X |
| 4,575,927 | 3/1986 | Braginski et al. ........... 174/126 S X |

Primary Examiner—Howard N. Goldberg
Assistant Examiner—Carl J. Arbes
Attorney, Agent, or Firm—Stefan J. Klauber

[57] ABSTRACT

The centers of a plurality of copper tubes are filled with tin and drawn to form Cu-Sn wires which are cabled around a core Nb wire; a plurality of these strands are provided in a copper tube, or a copper foil or finely wound copper wire; and a plurality of said tubes are packed into a copper can to form a billet which is drawn to produce a multifilament wire; and heat treatment is applied to cause the tin to diffuse and form the intermetallic $Nb_3Sn$ at the surface of the Nb filaments to produce the ultimate superconducting wire product.

18 Claims, 4 Drawing Figures

METHOD OF FABRICATING MULTIFILAMENT INTERMETALLIC SUPERCONDUCTOR

FIELD OF THE INVENTION

This invention relates to the field of manufacture of multifilamentary intermetallic superconductors of the A-15 type, such as $Nb_3Sn$ or $V_3Ga$; more particularly, it relates to such a method which does not involve the so-called "bronze process," provides ease of fabrication, and results in a high current density conductor.

BACKGROUND OF THE INVENTION

The phenomenon of superconductivity, that is, zero electrical resistance, possessed by many metals at near absolute zero temperatures, has received steadily increasing attention in recent years due to the development of materials which exhibit this property at sufficiently high temperatures, while carrying relatively high currents in the presence of sufficiently great magnetic fields as to be commercial utility. Among the more useful of the superconducting materials developed to date are the intermetallic compounds $Nb_3Sn$ and $V_3Ga$. These materials have sufficiently good superconductive properties as to render them attractive in the development of useful electrical machinery. However, the manufacture of these intermetallic compounds is complicated both by the nature of the compounds themselves, which are metastable phases not readily fabricated by simple chemical processes, and which are so brittle that the bending of a conductor formed of either of these compounds is substantially precluded, and by the preferred design of conductors using these materials, which generally have required many individual filaments of the superconductive material to be embedded in a matrix of a non-superconductive material, preferably a metal having high electrical conductivity such as pure Cu.

Recently developed processes for the manufacture of $Nb_3Sn$ have generally involved the so-called "bronze process", in which rods or wires of Nb are dispersed throughout a matrix consisting of a CuSn bronze. The assembly is worked to a desired final size and heat treated, at which time $Nb_3Sn$ is formed at the interfaces between the Nb rods and the bronze matrix by diffusion of the Sn from the bronze. See, for example, U.S. Pat. No. 3,918,998. Refinements of the bronze process include providing a quantity of good electrical conductor such as pure Cu in close proximity to the $Nb_3Sn$ filaments and isolating this pure Cu from diffusion of Sn which would destroy the high electrical conductivity of pure Cu, by interposing a layer of material impermeable to Sn therebetween such as, for example, Ta; see, e.g., U.S. Pat. No. 4,205,199. The same process is used to form multifilamentary $V_3Ga$; V rods are disposed in a CuGa bronze matrix.

A quantity of a good electrical conductor in close proximity to the superconductive material is useful as an alternate current path or shunt in situations where it is likely that some fraction of the superconductive filaments will return to the normally-conducting state, which can happen, for example, in a rapidly-varying magnetic field.

The present state of the art, as outlined above, uses the bronze process to achieve multi-filamentary intermetallic superconductors which are stabilized by the provision of a quantity of a good electrical conductor. However, the bronze process is not without its difficulties. Chief among these is the fact that in order to improve the maximum current density carried by the superconductor, it is desirable to increase the amount of superconductive material per unit of cross-sectional area of the whole conductor. To do this it is clear that a sufficiency of tin must be provided, which could be done simply by increasing the percentage of tin in the bronze. Unfortunately, the production of a large number of extremely fine filaments demands a large number of metal-working steps—chiefly drawing—during which the bronze workhardens very quickly, necessitating frequent time-consuming and costly annealing operations. In fact, the practical maximum volume percentage of tin in the bronze which permits working is 15%; and even at this relatively low value, annealing is required roughly every two to six drawing operations, at a rate of 15–20% area reduction per pass.

Patents which concern the bronze process or are of general interest are:
U.S. Pat. No. 3,472,944
U.S. Pat. No. 3,728,165
U.S. Pat. No. 3,731,374
U.S. Pat. No. 3,807,041
U.S. Pat. No. 3,838,503
U.S. Pat. No. 3,910,802
U.S. Pat. No. 3,930,903
U.S. Pat. No. 3,963,425
U.S. Pat. No. 4,195,199
U.S. Pat. No. 4,409,297
U.S. Pat. No. 4,501,062
U.S. Pat. No. 3,708,606
U.S. Pat. No. 3,800,414
U.S. Pat. No. 3,472,705
U.S. Pat. No. 3,710,000
U.S. Pat. No. 3,958,327
U.S. Pat. No. 4,073,666
U.S. Pat. No. 4,101,731

In U.S. Pat. No. 3,905,839, Cu coated Nb wires are arranged coaxially around a Cu coated Cu-Sn alloy wire or Sn wire, the preparation of which is not described, to provide a strand, the strand is inserted in a Cu tube and then drawn. Alternatively, the composite may be formed by providing a plurality of small diameter vertical apertures around a larger diameter vertical aperture in a Cu rod. The small diameter vertical apertures are filled with a plurality of Nb wires and a Sn rod is placed in the large diameter vertical aperture to form the intermediate composite. This composite may then be drawn prior to heat treatment to form the $Nb_3Sn$ alloy superconductor. Example 2 mentions pouring molten Sn into the apertures. Thus, this process involves using coated wires and arranging them in the described coaxial manner or drilling vertical apertures in a Cu rod.

In order to avoid the use of bronze, various powder metallurgical techniques have been devised, as described in U.S. Pat. No. 4,411,712. It has also been proposed in U.S. Pat. No. 4,224,735 to provide a Cu core in which are embedded filaments of Nb or V, and which is surrounded by alternating annular layers of Sn or Ga respectively, and of copper, the composite then being extruded, drawn and heat treated. In U.S. Pat. No. 4,447,946, a method is described in which Nb in wire form and Sn plated Cu in the form of wire or strip, are combined to form a composite, which may then be extruded and/or wire drawn, and then heat treated to convert the Nb filaments to $Nb_3Sn$ by diffusion. The present invention is an improvement on the method of U.S. Pat. No. 4,447,946, incorporated herein by reference, as will become apparent in the following description.

SUMMARY OF THE INVENTION

In accordance with the invention, a multifilament superconductor is fabricated of the type $A_3B$ where A is selected from the group consisting of Nb and V, and B is selected from the group consisting of Sn and Ga by carrying out the steps of:

(a) filling the center of one or more copper tubes with B or with a predominantly B - copper alloy, and drawing said tubes to form copper -B wires;

(b) cabling a plurality of said copper -B wires around a core A wire thereby forming the basic strand of this invention;

(c) bundling a plurality of the cables of step (b) with an enveloping layer of copper which may be in the form of a copper tube, copper foil or a plurality of finely wound copper wires.

This assembly may be worked up in a number of ways to the final multifilament superconductor, which may involve various regimes of compacting into hexagonal shapes, drawing, rebundling, cold extrusion and the like. Thus, following step (c) above, the method may be continued by:

(d) drawing the assembly of step (c) to reduce its diameter to a desired size; and (e) heat treating the product of step (d) to cause B to diffuse and form $A_3B$ at the surface of the A filaments.

In one variation, a plurality of the assemblies formed in step (c) may be inserted in a copper can to form a billet and then the billet drawn to reduce the diameter thereof to a desired size, after which the heat treating diffusion step is carried out.

A diffusion barrier may be used in the first bundling—of step (c)—or in the just mentioned second bundling.

For simplicity, the case where $A_3B$ is $Nb_3Sn$ will be discussed although it will be understood that the fabrication of $V_3Ga$ may be carried out in a similar manner.

Thus, the centers of one or a plurality of copper tubes are filled with tin or with a predominantly tin-copper alloy, e.g., up to a tin-7 weight % Cu alloy to form an initial composite. The percentage of tin in this composite may be freely selected, e.g. in the range of 10–50 weight % but is preferably about 20 weight % tin. Each is suitably sealed at the ends. This is drawn into a wire which is termed Cu-Sn wire.

A plurality of said Cu-Sn wires are cabled around a core Nb wire which may be Nb or predominantly Nb, viz., a NbTi wire containing about 1 weight % Ti. The relative size of the Nb wire and Cu-Sn wires is such as to produce a local ratio of Cu-Sn to Nb in the range of about 1.0:1 to about 1.5:1 depending on the end use of the conductor. It may be calculated as follows:

Local ratio $= N_c d^2_c / d^2_{Nb}$ where $N_c$ = number of wires around a Nb core
$d_c$ = diameter of Cu tube containing the tin core
$d_{Nb}$ = diameter of the Nb wire A plurality of the cables are bundled and inserted in a hollow copper tube, or alternatively wrapped in a copper foil or finely wound with copper wire. The copper tube may be protected by an internal diffusion barrier typically formed of tantalum or of niobium or vanadium.

The resulting filled copper tube is drawn to reduce its diameter in accordance with requirements of the superconducting wire product. Alternatively, a plurality of said filled copper tubes is rebundled and inserted in a hollow copper can—which may also be provided with an internal diffusion barrier—to form a billet, and then the billet, suitably sealed at its ends, is drawn to reduce the diameter thereof to the desired size of the superconducting wire. Either the first bundle or the second bundle or both may be drawn into a hexagonal shape as more fully described in U.S. Pat. No. 4,447,946. The finally drawn wire is heat-treated to cause the Sn to diffuse through said copper wires and form $Nb_3Sn$ at the surface of the Nb filaments. Typically this involves heating the wire to 550° C. to 750° C., in an inert atmosphere for sufficient time to allow diffusion equilibrium conditions to be established, at which time there is maximum conversion of Nb and Sn to the intermetallic reaction product $Nb_3Sn$.

In general, hot extrusion is not used during the process. Extrusion would generally be performed at elevated temperature and pressure resulting in high local temperatures that could cause the tin to melt and form a bronze with the copper, which is unwanted for the reasons abovementioned. Consequently, the process of the invention is carried out without resort to hot extrusion. However, extrusion at room temperature may be used.

Other variations are also useful. For example, in place of Nb wire, a multifilament Nb in Cu wire may be employed. The initial Cu-Sn composite cabled around the Nb wire can be isolated from other Nb filaments by wrapping this cable with Nb or Ta foil, and this, in turn, can have Cu cabled around it as a stabilizer. A plurality of these assemblies are then bundled and slid into a hollow copper tube as just described. In this way, each Nb filament is very close to a Cu stabilizer thus producing a very stable conductor.

Thus it can be seen that in the initial Cu-Sn composite, the tin is internalized. On the other hand, in U.S. Pat. No. 4,447,946, an assembly is formed of Nb wires and Cu on which Sn has been electroplated, and the assembly or a plurality of them is mechanically worked to reduce its cross section to the desired final wire diameter. One advantage of the new structure of this invention is that the new arrangement draws much better because ductile copper is on the outside of the initial Cu-Sn composite, rather than soft tin.

An object of the invention is to fabricate a Nb wire of very small thickness, for example, about 10 microns in diameter. By using a single Nb wire as a core and cabling around it multiple Cu-Sn wires, a basic strand of small diameter can be produced which, when a plurality of them are provided in a unit area, is adapted to achieve high current density. Tin surrounds each of the core Nb wires and is distributed in an excellent manner to enable it to diffuse to the Nb during the heat treatment step, as well as being supplied in higher amounts, viz., a higher ratio of Sn to Cu, by means of using internalized tin as compared with using copper electroplated with tin. As a consequence of the basic strand concept and the substantial supply of tin, since no area will be completely devoid of $Nb_3Sn$-covered Nb filaments, there are more such filaments yielding ultimately a higher current density. Other advantages also accrue, for example, there are favorable consequences with regard to the time-temperature regime for the diffusion step. Thus, the various features of the method of the invention can achieve a beneficial synergism.

BRIEF DESCRIPTION OF THE DRAWINGS

The invention will be described with reference to the drawings in which.

DETAILED DESCRIPTION

Figure 1:
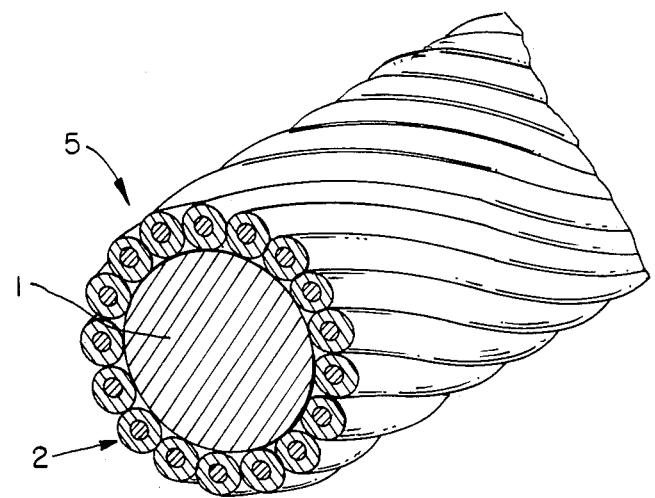
FIG. 1 shows in perspective the basic strand, e.g., a niobium wire surrounded by many of the Cu-Sn wires of FIG. 1A which are cabled around it.
Figure 1A:
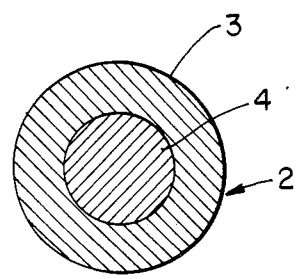
FIG. 1A is a cross-section of a Cu-Sn composite in which a copper shell surrounds a tin or tin -7 weight % copper core.
Figure 2:
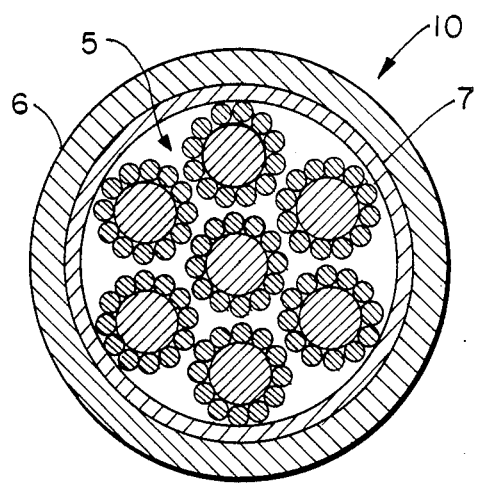
FIG. 2 is a cross-section of a plurality of the strands of FIG. 1 surrounded by an outer copper layer provided by a copper tube, with a barrier of niobium, tantalum or vanadium therebetween.
Figure 3:
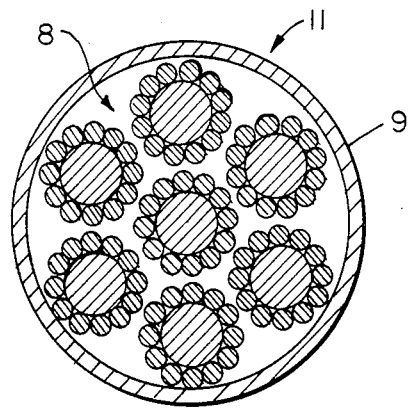
FIG. 3 is similar to FIG. 2 except that the outer copper layer comprises a copper foil or finely wound copper wire and the barrier layer is omitted.

With reference to the drawings, FIG. 1A shows a composite Cu-Sn wire 2 comprising a copper shell 3 surrounding a Sn or Sn-7 weight % Cu core 4. FIG. 1 illustrates the basic Cu-Sn-Nb strand 5 of this invention which is a composite single Nb core wire 1 clad with Cu-Sn. It comprises a single niobium wire 1 around which are cabled a plurality of the Cu-Sn wires 2 of FIG. 1A. FIG. 2 shows an assembly 10 comprising a plurality of strands 5, in this illustration seven of them, enclosed in a copper layer, in this case provided by a copper tube 6 with a barrier layer 7 of Nb, Ta or V therebetween. FIG. 3 is similar to FIG. 2 and shows an assembly 11 comprising a plurality of single strand Nb in Cu-Sn 8, as in FIG. 2, within a Cu foil or finely wound Cu wire 9 with the difference that the barrier is omitted. However, the assembly of FIG. 3 can be rebundled with a barrier around it and mechanical working carried out to reduce the diameter to the required size.

The assembly of FIG. 2 may be drawn directly or a plurality of them may be placed in a copper can and then drawn. In either case, the unit may be drawn into a hexagonal shape in a manner known in the art. Other modes of mechanical working are described in the following.

The basic structure contemplated in the present invention utilizes a Nb wire which is surrounded by a series of small copper wires or tubes, the center of each of which carries a tin filament. A number of variations may be employed in their bundling or rebundling. To illustrate, this structure is provided within a hexagonally shaped can or tube and there may be a totality of, for example, 37 of the sub-elements just described within each hexagonal unit. Then, for example, 37 of the same hexagonal units are packed one against the other within a surrounding or enveloping copper can to form a billet which is then drawn and heat treated to cause diffusion/reaction of the tin to $Nb_3Sn$ to form the ultimate wire product. Since there is more effective distribution of tin, the time for heat treatment can be reduced to a day or so.

The following example is intended to be illustrative but not limitative of the invention.

EXAMPLE

PROCESS FOR FABRICATION OF A $Nb_3Sn$ CONDUCTOR BY A CABLED, INTERNAL TIN PROCESS

The following is one of many process variations for making a $Nb_3Sn$ conductor by the present internal tin process.

The major process steps are:

(A) Fabrication of a copper clad tin wire.

(B) Fabrication (by cabling) of a single wire of niobium clad with the copper clad tin wires.

(C) Assembly of the Cu-Sn-Nb composite wire into a multi-strand conductor.

(A) FABRICATION OF A Cu-Sn COMPOSITE WIRE

A rod of tin is drawn to 0.25 inch diameter and is slid into a copper tube approximately 0.6 inch O.D. (outside diameter) by 0.280 inch I.D. (inside diameter). This is drawn to 0.0049 inch diameter by conventional wire drawing techniques.

The wire is then cleaned in detergent, etched in $HNO_3$ or $H_2SO_4$ solution, rinsed and dried.

(B) Fabrication (by cabling) of a single wire of niobium clad with the copper clad tin wire.

Sixteen wires prepared as described above are cabled around a 0.020 inch diameter niobium wire using standard cabling machines and techniques to produce the single strand Cu-Sn-Nb composite. This wire is compacted on the cabling machine by drawing it through a 0.028 inch diameter wire drawing die using isopropyl alcohol as a lubricant.

(C) ASSEMBLY OF THE SINGLE STRAND Nb COMPOSITE INTO A MULTIFILAMENT CONDUCTOR.

Sixty-one of the Cu-Sn-Nb composite are wrapped with a barrier of alternate Nb-Cu foils, each 0.005 inch thick. This is done by co-winding Cu foil and Nb foil about four times around the bundle.

The wrapped bundle is inserted into a copper tube 0.4 inch I.D. by a wall thickness of 0.032 inches and drawn into a hexagonal shape 0.36 inch flat to flat.

The hexagonal shapes are then cut into one foot lengths and 61 stacked into a 3.63 inch I.D. by 4 inch O.D. extrusion can. The can is welded and evacuated.

The extrusion can is extruded at room temperature to 1.5 inch diameter. The extruded rod is drawn to 0.020 inch diameter where each filament of Nb is about 2.5 $\mu m$ (micron) in diameter.

The wire is heat treated at about 700° C. for 50 hours to diffuse the tin throughout the matrix inside each barrier and form high current $Nb_3Sn$.

Alternately, in place of stacking an extrusion can, the composite of 61 single filament Nb wires can be drawn to 0.090 inch and 61 of these slid into a 1 inch O.D. by 0.872 inch I.D. copper tube which is processed to final size without extrusion.

It can be seen that the present method is capable of many variations without departing from the inventive concept and without sacrificing its chief advantages.

What is claimed is:

1. A method for the fabrication of a multifilament superconducting wire of the type $A_3B$ where A is selected from the group consisting of Nb and V, and B is selected from the group consisting of Sn and Ga which comprises the steps of:

(a) filling the center of one or more copper tubes with B or with a predominantly B-copper alloy and drawing said tubes to form copper -B wires, the ratio of B to Cu in the wire being between 10–50 weight % B;

(b) cabling a plurality of said copper -B wires around a core predominantly A wire;

(c) bundling a plurality of the cables of step (b) with an enveloping layer of copper;

(d) drawing the assembly of step (c) to reduce its diameter to a desired size; and (e) heat treating the product of step (d) to cause B to diffuse and form $A_3B$ at the surface of the A filaments.

2. A method for the fabrication of a multifilament $Nb_3Sn$ superconducting wire which comprises the steps of:

(a) filling the center of one or more copper tubes with tin or with a predominantly tin-copper alloy and drawing said tubes to form copper-tin wires, the ratio of Sn to Cu in the wire being between 10–50 weight % Sn;

(b) cabling a plurality of said copper-tin wires around a core predominantly Nb wire;

(c) bundling a plurality of the cables of step (b) with an enveloping layer of copper;

(d) drawing the assembly of step (c) to reduce its diameter; and (e) heat treating the product of step (d) to cause the Sn to diffuse and form $Nb_3Sn$ at the surface of the Nb filaments.

3. A modification of the method of claim 2 in which a plurality of the assemblies formed in step (c) or step (d) are inserted in a copper can to form a billet, after which drawing and heat treating diffusion steps are carried out.

4. A modification of the method of claim 2 in which a plurality of the products of step (d) are rebundled, placed in a copper extrusion can, extruded at room temperature and then drawn to reduce the diameter thereof to the desired size of the superconducting wire, after which said heat treating diffusion step is carried out.

5. A method as set forth in claim 2 in which, in step (a), the percentage of tin in the filled copper tube is about 20 weight % tin.

6. A method as set forth in claim 2 in which said alloy is up to a tin - 7 weight % Cu alloy.

7. A method as set forth in claim 2 in which, in step (c), the enveloping layer of copper is a copper tube.

8. A method as set forth in claim 2 in which, in step (c), the enveloping layer of copper is a copper foil.

9. A method as set forth in claim 2 in which, in step (c), the enveloping layer of copper is formed by a plurality of finely wound copper wires.

10. A method as set forth in claim 7 in which said copper tube of step (c) is provided internally with a diffusion barrier.

11. A modification of the method of claim 8 in which a plurality of the assemblies formed in step (c) or step (d) are rebundled, provided with a diffusion barrier around them, after which drawing and heat treating diffusion steps are carried out.

12. A method as set forth in claim 3 in whch the copper can is provided internally with a diffusion barrier.

13. A method as set forth in claim 2 in which the cable of step (b) is wrapped with Nb or Ta foil and then cabled with Cu wire as a stabilizer before carrying out step (c).

14. A method as set forth in claim 2 in which the relative size of the core Nb wire and Cu-Sn wires is such as to produce a local ratio of Cu-Sn to Nb in step (b) in the range of about 1.0:1 to about 1.5:1; the ratio being defined as:

local ratio = $N_c d_c^2 / d^2_{Nb}$ where $N_c$ = number of wires around a Nb core
$d_c$ = diameter of Cu tube containing the tin core
$d_{Nb}$ = diameter of the Nb wire.

15. A method for the fabrication of a multifilament superconducting wire of the type $A_3B$ where A is selected from the group consisting of Nb and V and B is selected from the group consisting of Sn and Ga which comprises the steps of:

(a) filling the center of one or more copper tubes with B or with a predominantly B-copper alloy and drawing said tubes to form copper -B wires, the ratio of B to Cu in the wire being between 10–50 weight % B;

(b) cabling a plurality of said copper -B wires around a core predominantly A wire;

(c) bundling a plurality of the cables of step (b) and surrounding it with an enveloping layer of copper;

(d) with or without rebundling the assembly of step (c), carrying out mechanical working without using hot extrusion to reduce the diameter to a desired size; and (e) heat treating the product of step (d) to cause B to diffuse and form $A_3B$ at the surface of the A filaments.

16. A method as set forth in claim 10 in which, in step (c) a plurality of the cables are bundled and wrapped with alternating Nb, Cu foils to provide a diffusion barrier before insertion in said copper tube.

17. A method as set forth in claim 10 in which, in step (c) a plurality of the cables are bundled and wrapped with alternating Nb, Cu foils to provide a diffusion barrier, inserted in a copper tube, drawn, then a plurality of such assemblies are rebundled, placed in a copper extrusion can, extruded at room temperature and then drawn to reduce the diameter thereof to the desired size of the superconducting wire, after which said heat treating diffusion step is carried out.

18. A method as set forth in claim 10 in which, in step (c) a plurality of the cables are bundled and wrapped with alternating Nb, Cu foils to provide a diffusion barrier, inserted in a copper tube, drawn, then a plurality of such assemblies are rebundled, drawn, and once more rebundled, placed in a copper tube and processed to final size without extrusion.

* * * * *